United States Patent
Kan et al.

(10) Patent No.: US 6,882,111 B2
(45) Date of Patent: Apr. 19, 2005

(54) STRIP LIGHTING SYSTEM INCORPORATING LIGHT EMITTING DEVICES

(75) Inventors: Peter Kan, North Vancouver (CA); Adrian Weston, Burnaby (CA)

(73) Assignee: TIR Systems Ltd. (CA)

( * ) Notice: Subject to any disclaimer, the term of this patent is extended or adjusted under 35 U.S.C. 154(b) by 0 days.

(21) Appl. No.: 10/615,529

(22) Filed: Jul. 9, 2003

(65) Prior Publication Data

US 2005/0007033 A1 Jan. 13, 2005

(51) Int. Cl.[7] .............................. H05B 37/00; F21S 4/00; F21V 1/00
(52) U.S. Cl. ...................... 315/122; 362/219; 362/217; 362/227
(58) Field of Search ............................... 315/112, 113, 315/121, 122, 291; 362/249, 227, 219, 225, 226, 240, 362, 396, 800, 238, 217; H05B 37/00; F21S 4/00; F21V 1/00

(56) References Cited

U.S. PATENT DOCUMENTS

| | | | |
|---|---|---|---|
| 5,321,593 A | 6/1994 | Moates | 362/251 |
| 5,343,375 A | 8/1994 | Gross et al. | 362/248 |
| 5,927,845 A | 7/1999 | Gustafson et al. | 362/152 |
| 6,056,420 A | 5/2000 | Wilson et al. | 362/249 |
| 6,158,882 A | 12/2000 | Bischoff, Jr. | 362/488 |
| 6,232,724 B1 | 5/2001 | Onimoto et al. | 362/161 |
| 6,283,612 B1 | 9/2001 | Hunter | 362/240 |
| 6,354,714 B1 | 3/2002 | Rhodes | 362/153.1 |
| 6,361,186 B1 * | 3/2002 | Slayden | 362/249 |
| 6,371,637 B1 | 4/2002 | Atchinson et al. | 362/555 |
| 6,394,626 B1 | 5/2002 | McColloch | 362/251 |
| 6,472,823 B1 | 10/2002 | Yen | 315/112 |
| 6,478,449 B1 | 11/2002 | Lee et al. | 362/249 |
| 2002/0114155 A1 * | 8/2002 | Katogi et al. | 362/219 |
| 2003/0193801 A1 * | 10/2003 | Lin | 362/249 |
| 2003/0223232 A1 * | 12/2003 | Belfer et al. | 362/219 |
| 2003/0223235 A1 * | 12/2003 | Mohacsi et al. | 362/240 |

OTHER PUBLICATIONS

Lumileds, Lumileds Lighting, LLC, Chipstrip Lighting System, Installation Manual, www.lumileds.com, dated Jul. 1, 2002.
Lumileds, Technical Data Chipstrip Lighting System, www.lumileds.com, dated Jul. 1, 2002.

* cited by examiner

*Primary Examiner*—Trinh Vo Dinh
(74) *Attorney, Agent, or Firm*—Sterne, Kessler, Goldstein & Fox, P.L.L.C.

(57) ABSTRACT

The invention provides an elongated lighting apparatus that can withstand temperature fluctuations. The elongated lighting apparatus comprises of the following elements: at least two elongated tubular members fabricated from translucent material. These elongated tubular members are fixed in an end-to-end configuration, separated by a region enabling for thermal expansion/contraction of the members. A substrate upon which a plurality of light emitting devices is placed, is slidably positioned inside each tubular member. End caps seal the open ends of the elongated tubular members. At least one of these end caps has a translucent protrusion that projects towards the region of separation. At least one light emitting device is positioned proximate to an end cap protrusion, thereby illuminating this region. A flexible interconnector encloses and visually conceals separating the adjacent members. The light emitting devices are electrically interconnected. An external power source provides a system to energize the light sources.

27 Claims, 8 Drawing Sheets

STRIP LIGHTING SYSTEM INCORPORATING LIGHT EMITTING DEVICES

FIELD OF THE INVENTION

The present invention pertains to the field of lighting systems and in particular to a strip lighting system incorporating light emitting devices.

BACKGROUND OF THE INVENTION

Neon lights are widely used in commercial applications as decorative enhancements and back lights. For example, they are used to highlight architectural features or to display names, logos and the like.

Neon lights are generally chosen for their neon effect or glare which demands the viewer's attention. This ability to draw attention outweighs the many drawbacks associated with neon lights. They are fragile, high voltage, energy consuming, monochromatic devices with inconsistent life patterns. They are labour intensive and require licensed tradesmen for installation and replacement. From a practical standpoint, any other type of lighting would be desirable if it could produce the attention demanding impact associated with neon.

There are several prior art references that disclose the use of light emitting devices as illuminators in a strip like illumination device. For example, U.S. Pat. Nos. 6,472,823, 6,371,637, 6,283,612, 5,343,375 and 5,321,593 describe strip type lighting devices which incorporate light emitting devices as the illumination source.

For example, U.S. Pat. No. 6,158,882 discloses a LED lighting apparatus in an elongated format used for illuminating vehicle interiors. The lighting apparatus comprises a light tube with an interior space and has a plurality of light emitting devices and current limiting resistors contained within the interior space of the light tube. The illumination intensity of the light emitting devices is controlled by a dimming module in electrical contact with the LEDs and electrically connected to the vehicle source of power.

In particular, U.S. Pat. No. 6,361,186 discloses a simulated neon lighting device which is created using light emitting devices as the light source. In this device an elongated, translucent diffuser of circular cross-section is mated with an elongated opaque tubular housing of constant cross-section with a lengthwise slot. The diffuser is held in longitudinally aligned abutment against the edges of the housing slot to form a chamber between the housing and the diffuser and light may only be emitted through the diffuser. A plurality of light emitting devices is aligned in a linear array in the chamber and the reflection and refraction of light by the tubular diffuser produces a neon-like glow or glare along the exposed surface of the diffuser. It was stated that this provides a durable, low voltage, low energy, non-gaseous, inexpensive, easy to install, easy to maintain, chromatically versatile, long life fixture which looks like neon light.

In addition, Lumileds Lighting, LLC provided a chipstrip contour lighting product that comprised of a linear array of solid-state light emitting devices mounted on an elongated printed circuit board. These circuit boards were encased inside a translucent polycarbonate housing, which was subsequently sealed at both ends. The unit included interconnects at each end in order to allow for the ease of connectivity of adjacent units. Ideally, a series of these units could be mounted end to end in order to produce a continuous contour of light. However, having regard to this mounting scenario, if there are thermal temperature gradients in the environment of use, the ends of adjacent units would have to be separated when fixedly mounted to a surface, in order to enable thermal expansion and contraction. FIG. 1 illustrates a typical end to end setup of adjacent housings 1 having inserted therein a printed circuit board 2 with LEDs 3 thereon. As identified, a separation region 4 between the housings is provided in order to account for thermal expansion due to temperature variations. This type of placement of adjacent housings however, produces dark spots within the separation region and therefore a continuous contour of light may not be perceived.

While there are many devices that incorporate light emitting devices integrated into an elongated lighting device in order to form a continuous light contour, the use of these devices is intended to be at fairly stable temperatures. However, upon the placement of these types of devices in an environment in which there will be thermal gradients, the nature of these devices through the incorporation of a plurality of different materials and therefore varying thermal expansion coefficients, in addition to the potential end to end placement thereof, can result in potential problems. These problems can include leakage and breakage of the units due to differential expansion of the various components, in addition to a discontinuous light contour being created if thermal expansion is not accounted for in the placement of the devices. Therefore there is a need for an new lighting system that enables the creation of a continuous contour of light in environments having thermal gradients.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a strip lighting system incorporating light emitting devices. In accordance with an aspect of the present invention, there is provided an elongated lighting apparatus illuminated along its entire length and capable of operation in environments subject to temperature fluctuations, said apparatus comprising: at least two elongated tubular members each having two ends, each elongated tubular member having a mounting means therein, said elongated tubular members being fabricated from a material that allows the passage of light therethrough and at least one end of each elongated tubular member is an open end, wherein the elongated tubular members are aligned end to end with a region of separation therebetween and at least one open end is adjacent to the region of separation; at least two substrates, each substrate having a plurality of light emitting devices thereon, at least one substrate being slidably connected to said mounting means within each of the elongated tubular members; at least two end caps for sealingly engaging with the open ends of the elongated tubular members, at least one end cap having a protrusion projecting towards the region of separation, said protrusion fabricated from a material that allows the passage of light therethrough and having at least one light emitting device proximate thereto; a flexible interconnector enclosing the region of separation, wherein the flexible interconnector is fabricated from a material that allows the passage of light therethrough, said flexible interconnector being illuminated by the light emitting device proximate to the protrusion; and means for connecting said plurality of light emitting devices to an electrical power source for energising said light emitting devices.

In accordance with another aspect of the invention, there is provided an elongated lighting apparatus illuminated along its entire length and capable of operation in environments subject to temperature fluctuations, said apparatus comprising: at least two elongated tubular members each having two ends, each elongated tubular member having a mounting means therein, said elongated tubular members being fabricated from a material that allows the passage of light therethrough and at least one end of each elongated tubular member is an open end, wherein the elongated tubular members are aligned end to end with a region of separation therebetween and at least one open end is adjacent to the region of separation; at least three substrates, each substrate having a plurality of light emitting devices thereon, at least one of the elongated tubular members having at least two substrates slidably connected to said mounting means therein; at least two end caps for sealingly engaging with the open ends of the elongated tubular members, at least one end cap having a protrusion projecting towards the region of separation, said protrusion fabricated from a material that allows the passage of light therethrough and having at least one light emitting device proximate thereto; biasing means electrically interconnecting adjacent substrates within a single elongated tubular member, said biasing means providing a resistive force for maintaining a light emitting device proximate to the protrusion upon thermal expansion or contraction of the apparatus; a flexible interconnector enclosing the region of separation, wherein the flexible interconnector is fabricated from a material that allows the passage of light therethrough, said flexible interconnector being illuminated by the light emitting device proximate to the protrusion; and means for connecting said plurality of light emitting devices to an electrical power source for energising said light emitting devices.

DETAILED DESCRIPTION OF THE INVENTION

Definitions

The term "light emitting device" is used to define light emitting diodes, high flux or high brightness light emitting diodes or any other form of semiconductor device enabling the creation of illumination.

Unless defined otherwise, all technical and scientific terms used herein have the same meaning as commonly understood by one of ordinary skill in the art to which this invention belongs.

The present invention provides an elongated lighting apparatus for use in environments subject to temperature fluctuations, wherein the lighting apparatus can be illuminated along its entire length during operation. The elongated lighting apparatus comprises several components which operate in harmony in order to provide this functionality. The lighting apparatus comprises at least two elongated tubular members fabricated from a material that allows the passage of light therethrough. These elongated tubular members are fixedly mounted on a surface in an end to end configuration, separated by a region enabling the thermal expansion/contraction of the members. Slidably positioned inside each tubular member is a substrate having a plurality of light emitting devices integrated thereon for providing illumination. The open ends of the elongated tubular members are enclosed by end caps that enable the sealing of these ends of the members. At least one of these end caps has a protrusion therein that projects towards the region of separation and this protrusion is fabricated from a material that allows the passage of light therethrough. Positioned proximate to a protrusion in an end cap is at least one of the plurality of light emitting devices, wherein this protrusion provides a means transmitting light into the region separating the elongated tubular members, thereby illuminating this region. Enclosing the region between the elongated tubular members is a flexible interconnector also fabricated from a material that allows the passage of light therethrough. The flexible interconnector provides a means for the visual concealment of the region separating the adjacent members. The lighting apparatus further comprises electrical interconnection between the light emitting devices and an external power source thereby providing a system for the energization of the light sources. In this manner the components of the elongated lighting apparatus of the present invention, provide for the thermal expansion/contraction of the components, while providing a continuous light contour.

Figure 1:
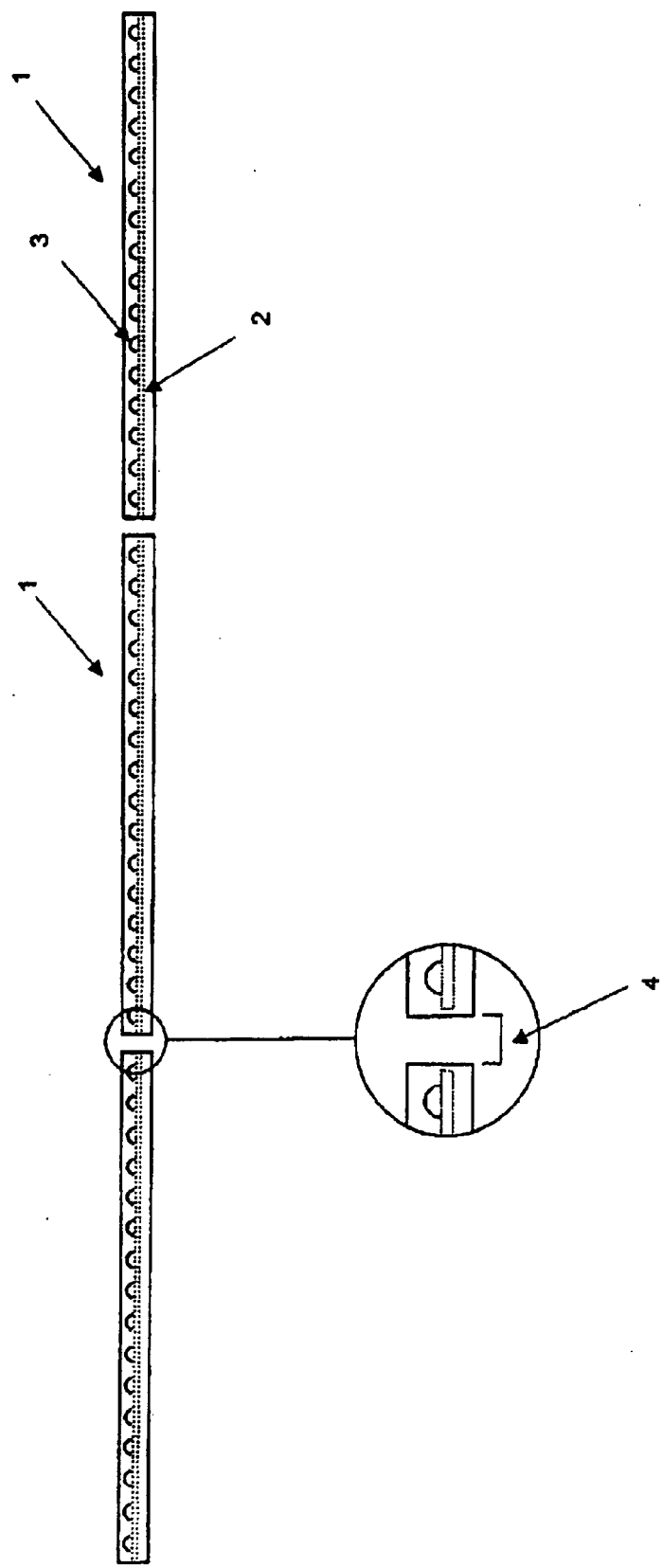
FIG. 1 illustrates an end to end alignment of adjacent housings as defined in the prior art.
Figure 2A:
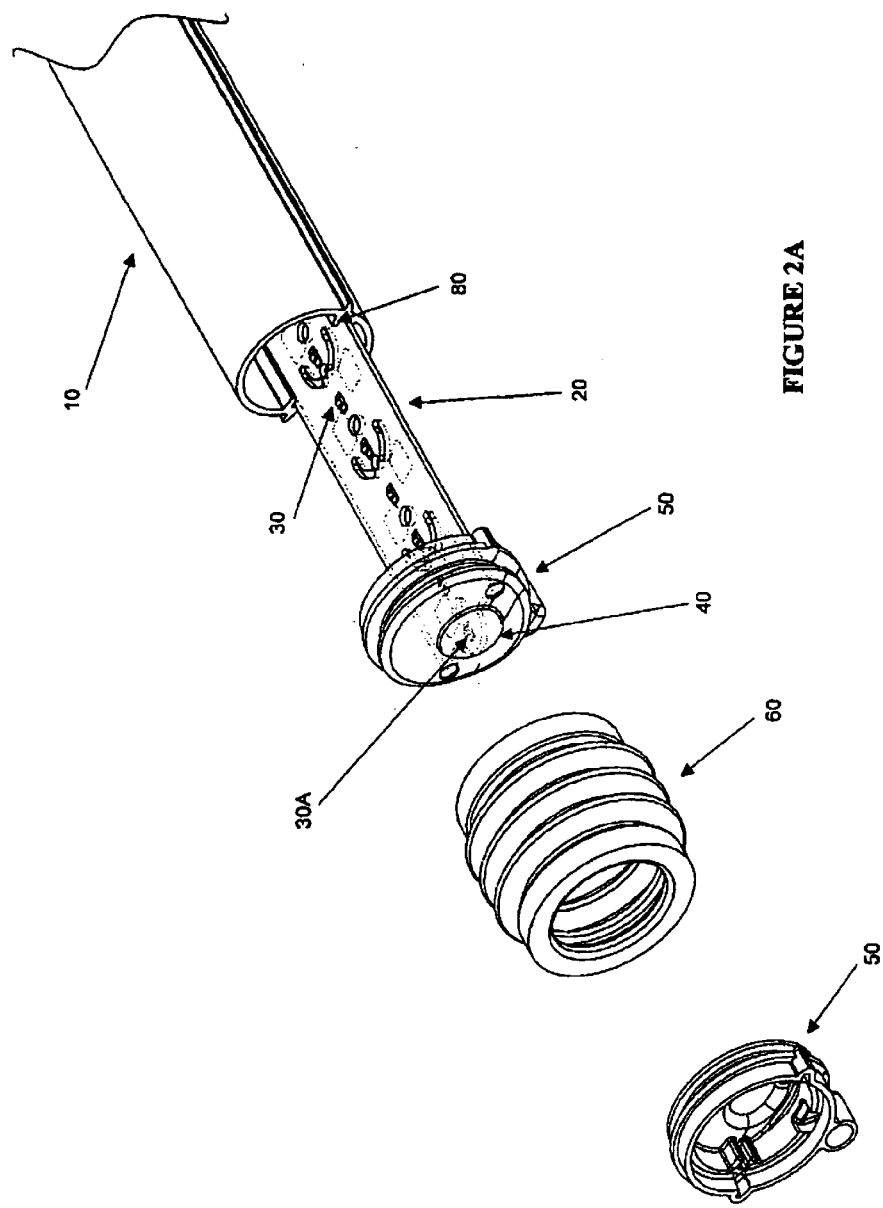
FIG. 2A is an exploded view of one embodiment of the present invention.
Figure 2B:
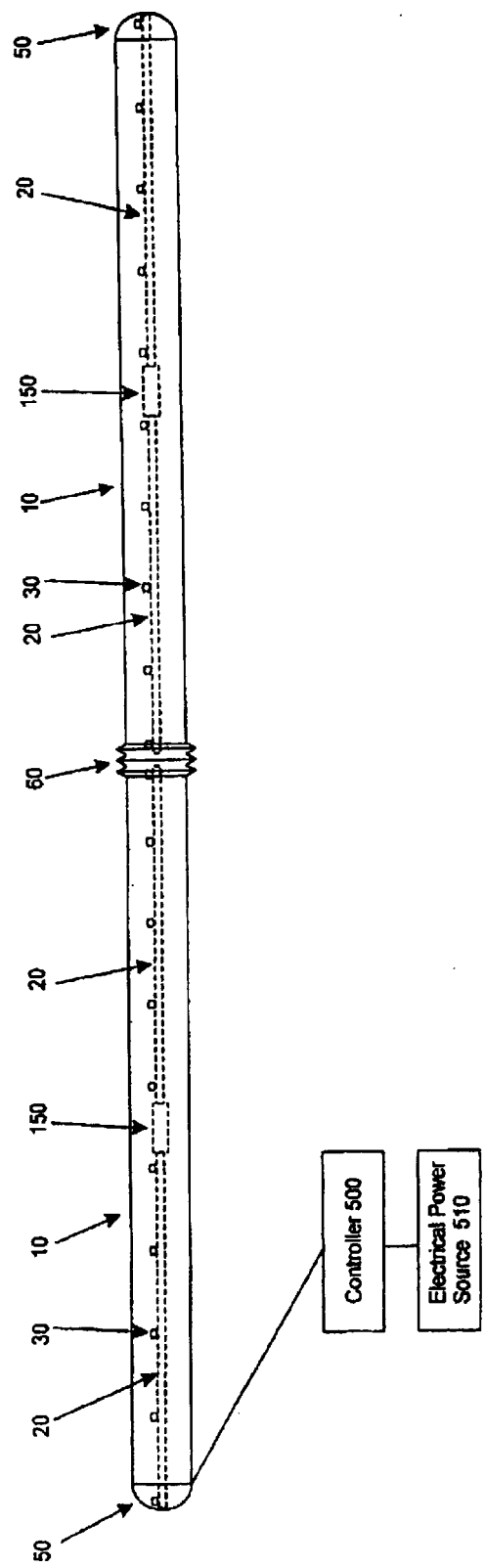
FIG. 2B is a side view of an elongated lighting apparatus according to one embodiment of the present invention.

With reference to FIG. 2A, one embodiment of the present invention is illustrated having particular regard to the region located between adjacently positioned elongated members. This is an exploded view of the lighting apparatus in order that the interconnection of the components can be identified. A first elongated tubular member 10, has a substrate 20 slidably connected thereto by a mounting means 80, which in this instance are in the form of two flanges. Integrated onto the substrate are a plurality of light emitting devices 30 for providing illumination of the apparatus. Enclosing the end of the elongated tubular member is an end cap 50 having a protrusion 40 therein which projects towards the region of separation of the adjacent members. Positioned within the protrusion 40, is a light emitting device 30A which provides a means for illuminating the region of separation of the adjacent elongated tubular members. In FIG. 2A, a second elongated tubular member is not shown, however the end cap for sealing this member is illustrated. The opposite ends of the elongated tubular members can be sealed with similar endcaps or alternate end caps depending on the desired functionality at that particular end of the tubular member. Enclosing the separation region between the adjacent elongated tubular members is a flexible interconnector 60 which can provide a means for visually concealing the separation region, wherein this interconnector is sufficiently flexible such that it is capable of lengthening or shortening as the elongated members undergo thermal expansion or contraction. FIG. 2B illustrates an embodiment of the present invention wherein the elongated lighting apparatus is coupled to an electrical power supply 510 and is optionally coupled to a controller 500. The substrates 20 within an elongated tubular member 10 are coupled together using a biasing system 150.

Elongated Tubular Member

Each elongated tubular member has at least one substrate slidably inserted therein, wherein this member provides a means for protecting the substrate and the associated electronics from the environment in addition to diffusing the light created by the light emitting devices within the elongated tubular member. Each elongated tubular member has at least one open end enabling the insertion of a substrate therein.

In one embodiment of the invention an elongated tubular member comprises an internal mounting system which enables the positioning of a substrate within the elongated tubular member. This mounting system provides a means for slidable connection between the elongated tubular member and the substrate thereby enabling differential thermal expansion of the substrate and the elongated tubular member to occur without one of these elements inducing stress within the other due to different coefficients of thermal expansion. In one embodiment of the invention, the mounting system can be fabricated in the form of a double flange fabricated on the internal surface of the elongated tubular member. This double flange can provide a groove in which a substrate can be slidably placed, wherein the width of this groove is sufficient to enable the slidability of the substrate therein. In an alternate embodiment, a single flange can be provided, wherein the flange limits the movement of a substrate within the internal cross section of the elongated tubular member in one direction. In this embodiment the movement in the opposite direction can be limited by the width of the substrate itself, through contact with the interior of the elongated tubular member. Additionally, a groove formation can be fabricated within the wall thickness of the elongated tubular in order to provide the mounting system, however in this case the thickness of the wall of the elongated tubular member in the region of groove fabrication may be greater than other areas in order to provide sufficient material to create this groove. Alternate forms of mounting systems can be provided within the interior of an elongated tubular member which provide the desired functionality and these alternate forms would be readily understood by a worker skilled in the art.

The positioning of the mounting system within the cross section of the elongated tubular member and hence the position of the light emitting devices associated with a substrate, can be determined in order to provide a desired lighting effect. For example, in the case where a single face of an elongated tubular member is visible, by positioning the illumination sources (light emitting devices) at a position further removed from the face of light emission, a reduction in lighting hotspots can be provided, wherein hotspots can be identified as more brightly illuminated locations. In this manner a more uniform lighting distribution may be realised along the length of the elongated tubular member. The alternate positioning of the light emitting devices can produce more apparent lighting hotspots if this effect is desired. Alternately, if an elongated tubular member can be seen from both sides, the central positioning of the mounting system may be more desirable and incorporates a substrate with light emitting devices on both side thereof, for example.

In one embodiment of the invention, an elongated tubular member further comprises an external mounting feature, which provides a means for the securement of an elongated tubular member to a surface. This mounting feature can be provided in the form of a ridge or flange which is fabricated on the external surface of the elongated tubular member and can provide an attachment location for a connection device, wherein this connection device is fixedly connected to the surface. The connection device can be in the form of a clip, clamp or any other type of device which would be able to connect with the external mounting feature provided on the elongated tubular member. This external mounting feature can be provided along the entire length of the elongated tubular member thereby enabling the connection device to secure itself at any point along the length of the member. Optionally, the mounting feature can only be provided at predetermined positions along the length of the member.

In one embodiment of the invention, a single connection device is used to secure a single elongated tubular member to a surface. In this manner the thermal expansion/contraction of the elongated tubular member is not restricted by the connection device as it would be if two connection devices where used. In the case of two connection devices, the expansion and contraction of the length of the elongated tubular member between the connection devices may be limited, if no means for enabling differential movement of the elongated tubular member with respect to the connection device is provided. If one connection device is used to secure each elongated tubular member to the surface, this connection device can be positioned at the central length point of the elongated tubular member to provide for example, balance, ease of installation or uniformity of expansion/contraction within the region of separation of the elongated tubular members.

Figure 3:
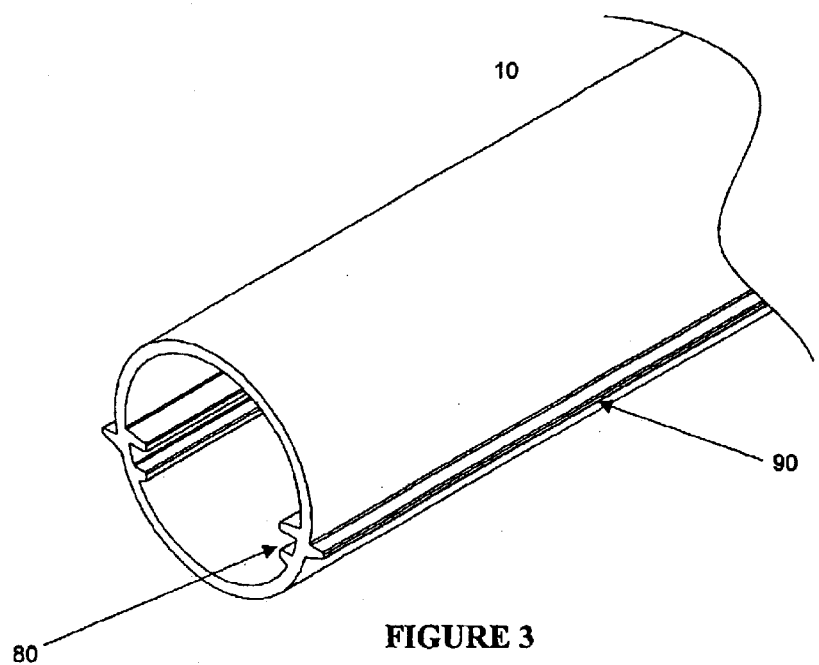
FIG. 3 is a perspective view of an elongated tubular, member according to one embodiment of the present invention.

With reference to FIG. 3, a perspective view of one embodiment of an elongated tubular member 10 is illustrated. The elongated tubular member comprises a mounting system 80 provided on the internal surface of the member and a mounting feature 90 on the exterior thereof to provide for securement to a surface at the deployment site.

In one embodiment of the present invention, the elongated tubular member can be fabricated in a manner such that a curved member is produced. This type of feature can be appropriate if the surface of the deployment site is curved or if a particular design is desired to be created using the apparatus of the present invention. The range of the radius of curvature of the elongated tubular member can be between 1 m to 10 m or may be greater, depending on the desired effect. In this case the one or more substrates to be inserted into an elongated tubular member of this configuration would be fabricated with a similar radius of curvature thereby enabling ease of their insertion therein. As would be readily understood, the radius of curvature of an elongated tubular member should be consistent over its length in order to enable the insertion of the one or more substrates within this member. However, multiple interconnected members having different radii of curvature can be interconnected to produce a desired effect.

In one embodiment of the invention, an elongated tubular member can be fabricated in a number of cross sectional shapes, wherein a particular shape may provide a desired illumination characteristic or architectural feature, for example. Potential cross sectional shapes of an elongated tubular member can be circular, rectangular, trapezoid, octagonal or any other shape desired or optionally the cross section shape of the elongated member can change over its length. However, if the cross section of the member changes over its length, the positioning of the mounting system within the interior of the elongated tubular member should be consistent in order to enable the insertion of one or more substrates therein.

In one embodiment of the invention, an elongated tubular member can be designed in a manner that it is fabricated from a combination of multiple pieces. For example, a rear portion can be mounted on a surface at the deployment site and the front can be removable or interchangeable. This type of feature can enable the modification of the look and illumination characteristics of an elongated tubular member without the complete replacement of the entire section. These multiple pieces can clip or snap together forming a water tight seal along the length of the elongated tubular member.

The elongated tubular member can be manufactured from a plurality of materials, however the material selected must enable the passage of light therethrough. Possible materials can include plastic, polycarbonate, fibreglass or others as would be readily understood. For example, if fibres are integrated into the material, these elements may provide an additional visual feature for the elongated tubular member during its illumination. In addition, the material can be any colour, wherein the colour of the material can be used to produce the desired lighting effect, for example green or red light or may further enhance the colour of light being produced by the light emitting devices. Additionally the material colour can change along the length of the elongated tubular member. The material may also have a milky or opaque appearance when not illuminated, thereby being able to conceal the internal components during periods of non illumination.

In one embodiment of the invention, an elongated tubular member is fabricated such that additional, diffusion, refraction or reflection characteristics can be provided. The member can be fabricated such that along its length or at desired or random locations, a prismatic effect is integrated into the member in the form of lenses or other light manipulating devices. This type of effect can be produced by for example varying the cross sectional shape of the elongated tubular member, varying the thickness of the walls, insertion of elements having the desired characteristics or other means as would be readily understood. In addition, reflectors and refractors can be integrated into the member enabling the redirection of the light being produced by the light emitting devices. In this manner, light which would not have been visible due to its direction of projection, can be redirected such that it is visible, thereby potentially improving the desired lighting capability of the apparatus. For example, if the lighting system is illuminating a canopy and a person will typically be viewing this canopy from a position which is horizontal thereto or below, the angle of projection of the created illumination may be desired to be to be within the 90 degree region, for example from directly below to horizontally in front of the illumination system. In this example, reflectors can be, integrated onto the internal surface such that light is projected in this direction only.

The fabrication of an elongated tubular member can be provided by a number of methods including extrusion, injection moulding or other methods as would be readily understood by a worker skilled in the art. For example, if the member is extruded, the cross section thereof will typically be uniform over the entire length and may provide ease for length adjustment at the installation site since all features associated with the elongated tubular member are provided along the entire length.

Lighting Components

The lighting components associated with the elongated lighting apparatus comprise a plurality of light emitting devices that are associated with a substrate which is inserted into an elongated tubular member, wherein these lighting components provide the illumination. The light emitting devices are electrically interconnected to a power source which provide a means for their activation. There may be a single power source for the entire lighting apparatus or a number of power sources wherein a power source is used to energise a predetermined number of light emitting devices or for example all of the light emitting devices within one, two or three elongated tubular members. In the event where a power source is used for the activation of the light emitting devices in multiple elongated tubular members, these members are electrically interconnected in a manner that can maintain the sealed nature of the elongated tubular member.

Figure 4:
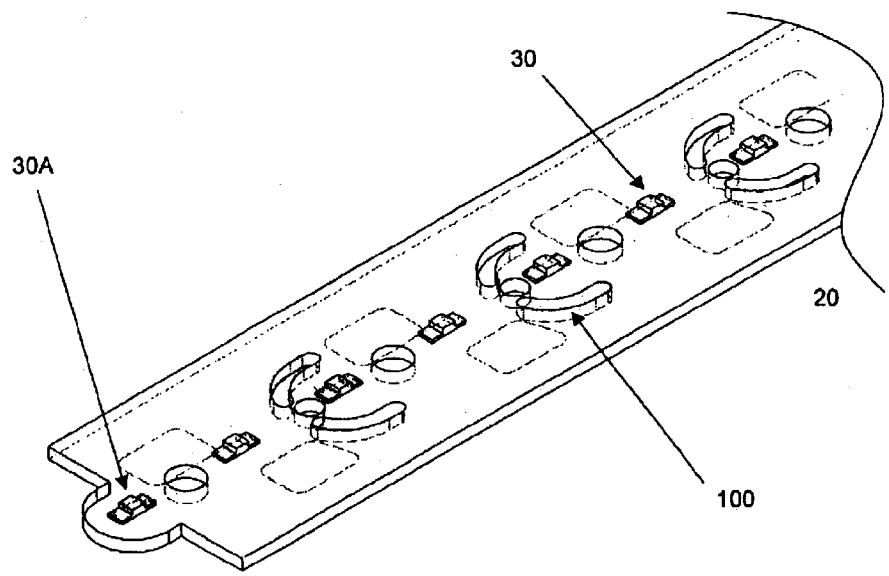
FIG. 4 is a perspective view of a substrate having light emitting devices thereon, according to one embodiment of the present invention.

At least one light emitting device is positioned on a substrate in a manner that enables its positioning proximate to the protrusion provided in an end cap that is sealingly connected to an open end of an elongated tubular member. This light emitting device provides a means for the illumination of the separation distance between adjacent elongated tubular members. As such this at least one light emitting device must be positioned at the end of the substrate proximate to the end cap. In one embodiment of the invention and as illustrated in FIG. 4, a substrate is designed such that the end thereof is capable of insertion into the protrusion that is integrated into an end cap. In this manner a light emitting device 30A can be positioned within the protrusion thereby potentially enhancing the illumination of the separation region. The shape of the end of the substrate can be determined by the size and shape of the protrusion in the end cap or optionally, a standard end of the substrate can be designed such that it is compatible with a plurality of shapes of protrusions.

In one embodiment of the invention, a substrate can be designed in a manner such that its length can be modified such that this modification of the length does not affect the functionality thereof. As illustrated in FIG. 4, modification locations 100 can be predefined on a substrate wherein upon the modification of the substrate and appropriate shape of the new end of the substrate is realised. In addition, the modification locations 100 provided on a substrate can be spaced uniformly along the length of a substrate or can optionally be positioned at varying locations along the length of the substrate. For example, one end of a substrate may have modification locations spaced at one inch intervals and the opposite end of the substrate may have modification locations spaced at two inch intervals. The spacing of the light emitting devices may be determined based on the modification locations on the substrate and therefore there may be denser clusters of light emitting devices at certain regions of a substrate, and the control of the intensity of the illumination produced by the light emitting devices can enable a uniform intensity of light being produced. Due to the ability to modify the length of a substrate, a standard substrate can be manufactured thereby resulting in a potential cost savings associated with the manufacturing process due to the standardised production of substrates.

In one embodiment of the invention, the light emitting devices can be arranged in a linear one dimensional array or a planar two dimensional array. A two dimensional array can provide a means for the integration of more light emitting devices onto a substrate and therefore an increase in the illumination provided thereby. In addition, the light emitting devices can be designed in order to produce a desired visible wavelength of light thereby producing the desired illumination colour. Optionally, the design of the light emitting device can be such that the desired illumination colour is a combination of the wavelength produced by the light emitting device and its interaction with the type and/or colour of the material used to form the elongated tubular member. Additionally, in order to produce a desired effect, varying light emitting devices and hence colour illumination produced thereby can change along the length of the substrate.

In one embodiment, wherein the light emitting devices are arranged in a two dimensional array, there can be a collection of light emitting devices in a direction perpendicular to the longitudinal axis of the substrate. For example, these light emitting devices can produce red, green and blue light respectively, wherein using specific control parameters for each of these three colours light emitting devices can enable the production of any visible colour. In this manner a particular elongated lighting apparatus is capable of producing any visible colour in the spectrum in addition to adjusting this colour during operation.

In one embodiment of the invention controllers are integrated into the elongated lighting apparatus which provide a means for controlling the activation and the illumination level produced by the light emitting devices. In this manner the various light effects can be produced by the elongated lighting apparatus, for example the simulation of movement of the illumination along the length of the apparatus. In addition, the control of the light emitting devices can be used in order to control the illumination level produced thereby. In the case where a uniform lighting level is desired along the length of the lighting apparatus either the density of the placement of the light emitting devices should be uniform or alternately in areas of a higher density of light emitting devices these elements should be controlled in a manner that can reduce the illumination intensity produced by each light emitting device such that the summation thereof is uniform with other locations on the substrate. For example, a resistor can alter the current being supplied to a light emitting device and thus adjust the illumination level produced thereby, alternately the controller can be in the form of a microprocessor. A worker skilled in the art would readily understand the type of controllers which would be required in order to provide a desired effect.

In one embodiment of the invention, the substrate is in the form of a printed circuit board wherein the electrical interconnection and the controllers of the light emitting devices is integrated thereon. This type of configuration can produce a simplified manner is which to fabricate the elongated lighting apparatus on site, for example.

In one embodiment of the invention, one or more reflectors can be integrated on a substrate, wherein these reflectors provide a means for redirecting the light produced by the light emitting devices to a more desirable location. These reflectors can be designed in a linear configuration wherein they are provided along the length of a substrate or optionally a particular reflector can be associated with a particular light emitting device. The shapes and design of a reflector is dependent on the desired redirection of the light being produced by one or more light emitting devices as would be readily understood by a worker skilled in the art.

End Cap

The open ends of the elongated tubular members are enclosed by end caps that enable the sealing of these members. At least one of the end caps proximate to a region of separation, has a protrusion therein that projects towards the region of separation and this protrusion is fabricated from a material that allows the passage of light therethrough. The protrusion within the end cap provides a means for directing and distributing light generated by a light emitting device proximate thereto, into the separation region resulting in the illumination of this region. One embodiment of an end cap according to the present invention is illustrated in multiple views in FIGS. 5A, 5B and 5C.

While illuminating the separation region from only one side thereof can be sufficient, by providing end caps with projections therein and the proximate light emitting devices, on both ends of the elongated tubular members which are adjacent to the region of separation, a more even and uniform distribution of light within the region of separation can be provided.

The location of the protrusion that is fabricated in an end cap can be determined based on the positioning of the substrate within the elongated tubular member thereby enabling the alignment of a light emitting device within the protrusion. As such the protrusion can be aligned with the centre line of the end cap or alternately it can be positioned such that it is above or below the centre point of the end cap.

The shape of the protrusion can be designed in a manner such that a desired optical performance is provided, thereby illuminating the separation region in a desired manner. For example, a partial spherical shaped protrusion can enable relatively even light dispersion within the separation region, while a protrusion with a number of planar sides, for example a partial cube or octahedron can result in a more segmented illumination of the separation region. In one embodiment of the invention, additional optics can be integrated into a protrusion which can enable light focusing, separation, reflection or directing of the light along a desired path. These types of optics can include refractive elements, prisms, reflectors and other optical components which would provide the desired effect and would be readily understood by a worker skilled in the art.

Figure 5A:
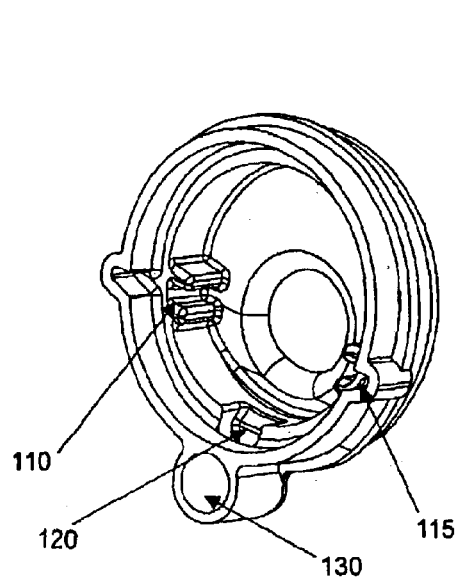
FIG. 5A is a perspective view of an end cap according to one embodiment of the present invention.
Figure 5B:
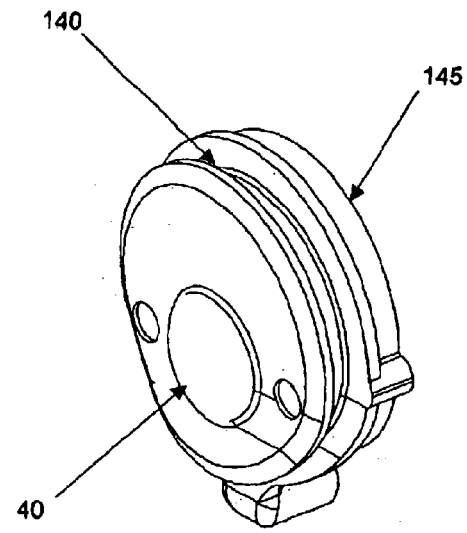
FIG. 5B is another perspective view of an end cap according to one embodiment of the present invention.
Figure 5C:
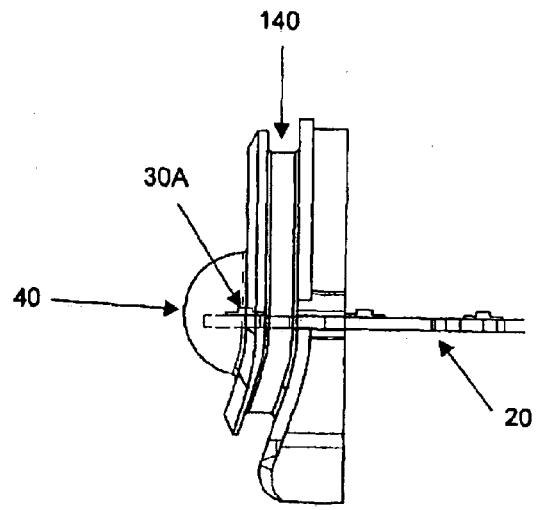
FIG. 5C is a side view of an end cap having a substrate inserted herein according to one embodiment of the present invention.

The end cap is used to seal the open ends of the elongated tubular members and this end cap can form this seal with either the interior or exterior surface of the member. This seal can be formed through the use of glue, sealing rings or a pressure type fit between the end cap and the member or other means. With reference to FIGS. 5A and 5B, in one embodiment of the invention the interconnection surface 145, is designed to be placed on the exterior of the elongated tubular member and the end cap includes nodules 115 which also enclose the mounting feature associated with elongated tubular member. In one embodiment the end cap further comprises an attachment feature which provides for its interconnection with a flexible interconnector. It should be noted that this attachment feature does not have to provide a seal since the flexible interconnector only encloses a separation region between the elongated tubular members. As illustrated in FIG. 5C the attachment feature 140 can be in the form of a groove wherein a lip fabricated on the flexible interconnector can be inserted into this lip.

In one embodiment of the invention and with further reference to FIG. 5A, there are provided an entrance aperture 120, an exit aperture 130 and a conduit therebetween in order to enable wire or cable to exit an elongated tubular member while still maintaining the sealing quality of the end cap. This feature can provide a means for a power supply to be electrically connected to the substrate within an elongated tubular member in addition to enabling the electrical interconnection of substrates in adjacent elongated tubular members. In order to maintain the sealing quality of the end cap which incorporates these apertures, the aperture can be positioned at the bottom of an end cap and thereby limit the movement of moisture into the elongated tubular member or optionally upon the insertion of the wire or cable within the apertures a sealing substance, for example caulking, can be used to provide additional sealing qualities.

In one embodiment, an end cap is fabricated with a substrate retaining system which provides a means for maintaining the position of the substrate within the end cap and thus predetermining the position of the light emitting device proximate to the protrusion. This feature, as with the elongated tube can be fabricated in the form of a double or single flange or alternately can be fabricated in the form of a groove. FIG. 5A illustrates the substrate retaining system 110 as a double flange type configuration.

In one embodiment of the invention, the end cap can have fabricated within its interior a clip type feature which can be used to interconnect the end cap with the substrate which is inserted within the elongated tubular member, thereby maintaining the position of the substrate during differential expansion/contraction of the apparatus. In this manner the proximity of a light emitting device to a protrusion within the end cap can be maintained. This type of mechanical connector between the substrate and end cap would typically be provided at one end of a elongated tube if there is a single substrate therein, or both ends if there are at least two substrates. If there are two substrates the electrical interconnection therebetween can be provided by simple wires that are of sufficient in length to account for maximum differential movement between the elongated tubular member and the substrates.

The end cap can be manufactured from a plurality of materials, however the material selected must enable the passage of light therethrough. Possible materials can include plastic, polycarbonate, fibreglass or others as would be readily understood. In addition, the material can be any colour, wherein the colour of the material can be used to produce the desired lighting effect, for example green or red light or may further enhance the colour of light being produced by the light emitting devices. As the end cap is typically concealed by a flexible interconnector, an end cap can be formed from a transparent material. In one embodiment wherein the end cap is fabricated from a transparent material, the external faces of the end cap, excluding the surfaces concealed by a flexible interconnector, for example the protrusion, are fabricated with a textured finish in order to diffuse light in a plurality of directions, which can result in a more distributed illumination and more even illumination along the entire length of the elongated lighting apparatus.

Flexible Interconnector

A flexible interconnector encloses the separation region between two adjacent elongated tubular members thereby enabling the concealment of this region. This connector is designed to undergo deformations upon the expansion/contraction of the elongated tubular members to which it is connected, while maintaining the enclosure of the separation region. A flexible interconnector is fabricated from a material that enables the passage of light therethrough thereby enabling the visual illumination of this region. As with the elongated tubular member, the flexible interconnector can be fabricated from a coloured material thereby resulting in the adjustment of the visible wavelength that is produced by the light emitting device proximate to the protrusion in an end cap.

Figure 6:
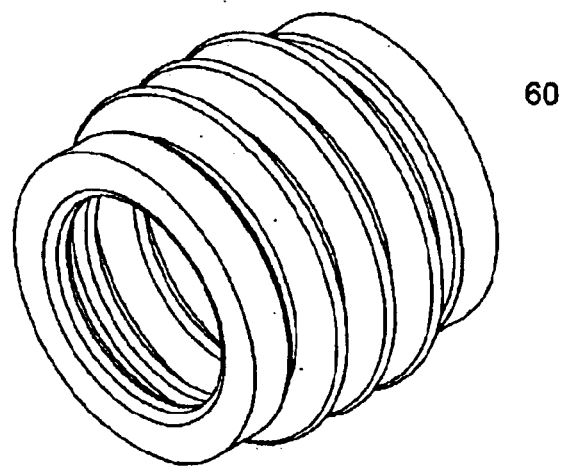
FIG. 6 is a perspective view of a flexible interconnector according to one embodiment of the present invention.

In one embodiment of the invention, the flexible interconnector is fabricated from a highly flexible and elastic material wherein this material linearly encloses the separation region. Alternately the flexible interconnector is designed having a bellow type configuration as illustrated in FIG. 6 and fabricated from a flexible material. The bellow type structure of the flexible interconnector can provide additional structural strength in the direction perpendicular to the accounted expansion/contraction of the elongated tubular members and thereby may be more resistant to movement in this direction due to snow loading, wind or rain, for example.

In an alternate embodiment of the invention, the flexible interconnector can be fabricated as a telescopic device wherein stiff or rigid members slide inside on another in order to account for the expansion/contraction of the elongated tubular members.

The flexible interconnector can be interconnected with either an end cap or the elongated tubular member directly depending on the design of the components. In one embodiment, the flexible interconnector comprises a lip at its end which interconnects with an end cap by way of a groove 140 formed therein as illustrated in FIG. 5C. Through the interconnection of the flexible interconnector with the end cap, modification of the length of an elongated tubular member would not affect the securement of the flexible interconnector as would happen if a groove for the interconnection was formed within the elongated tubular member.

Biasing System

In one embodiment, wherein two or more substrates are enclosed within a single elongated tubular member a biasing system is used to interconnect these substrates, wherein this biasing system provides a means for electrical interconnection of the substrates in addition to supplying a resistive force in order to provide a means for maintaining the position of the one or more light emitting devices within the protrusion in an end cap. In this manner the biasing system enables differential expansion/contraction of the substrate with respect to the elongated tubular member while maintaining a desired position of the substrates within the member.

The biasing system comprises two conductive elements and a resistive element. The conductive elements provide electrical interconnection between the substrates and is capable of accommodating differential movement between the substrates while maintaining an electrical connection and not stressing connection points between the substrates and the conductive element. As would be readily understood one conductive element provides positive charge connection and the other provides negative charge connection between the substrates. The resistive element provides a restorative force for maintaining the position of the substrates at the ends of the elongated tubular member.

Figure 7:
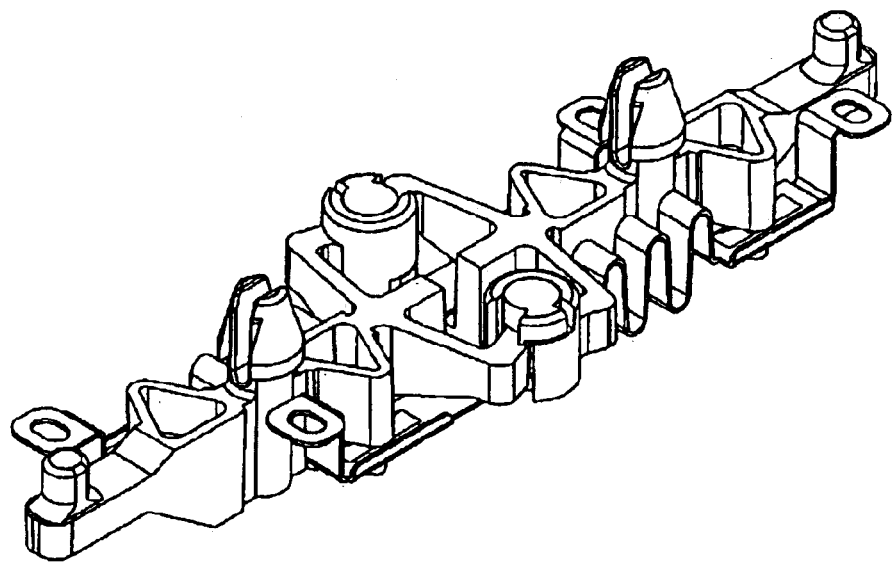
FIG. 7 is a perspective view of a biasing means for interconnecting adjacent substrates within an elongated tubular member according to one embodiment of the present invention.
Figure 8:
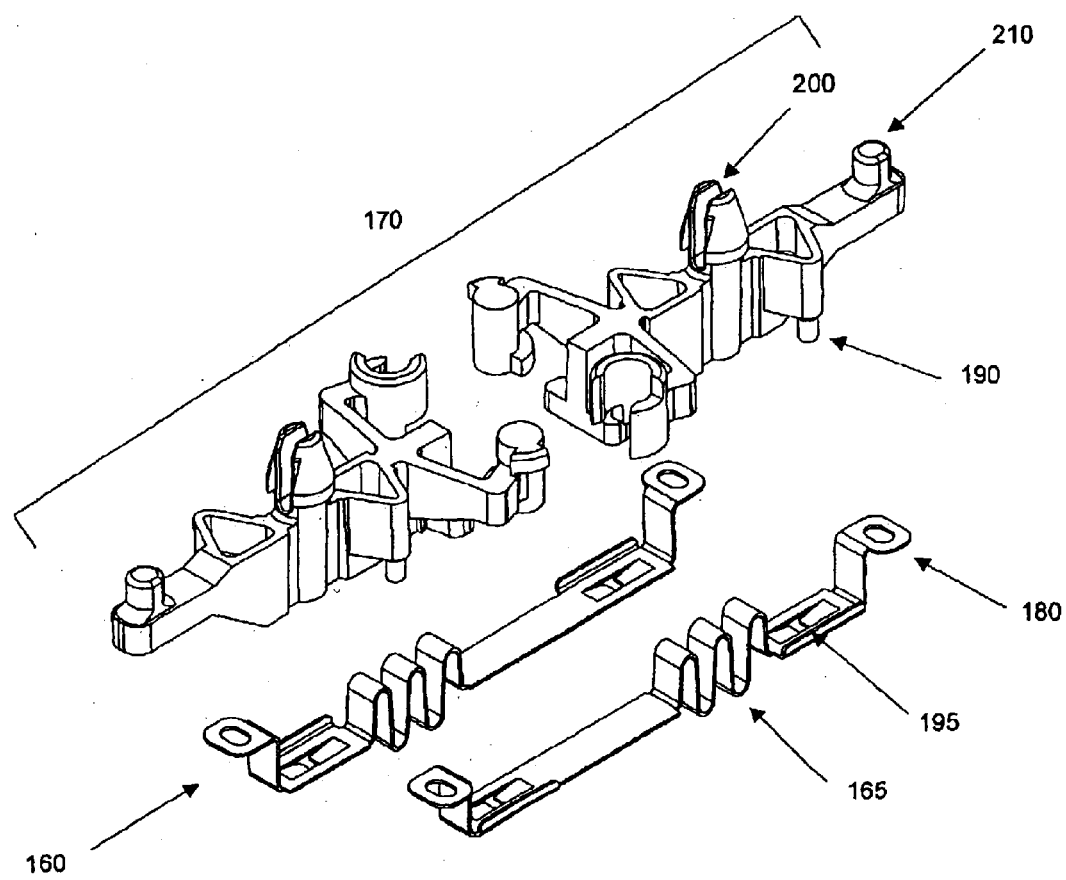
FIG. 8 is an exploded view of the biasing means according to FIG. 7.

FIG. 7 illustrates a biasing system according to one embodiment of the invention and FIG. 8 illustrates an exploded view thereof. The conductive elements 160 have a spring like element 165 in a middle region which provides for the elongation or contraction of the conductive element. With regard to FIG. 8, the stud 190 on the resistive element inserts into an opening 195 in the conductive element thereby ensuring that the connection point 180 in this vicinity does not move under differential thermal expansion/contraction. This type of feature is provided for the two connection associated with each conductive element. As an alternate possibility, the conductive element can be a simple wire connection which has sufficient slack in order to enable the maximum potential space between the connection points on adjacent substrates to be realised.

The resistive element is designed such that the deformation thereof is confined to a predetermined region and as such the remainder of the resistive element essentially does not deform due to differential thermal expansion/contraction. In this manner the portion of the resistive element which interconnects with a substrate does not introduce a level of undesirable stress into the substrate to which it is connected. The region of deformation within the resistive element is designed such that at a temperature wherein the greatest separation distance between the substrates within an elongated tubular member is realised, the resistive element is still minimally compressed thereby still forcing the substrates to the extremities of the elongated tubular member.

Figure 9:
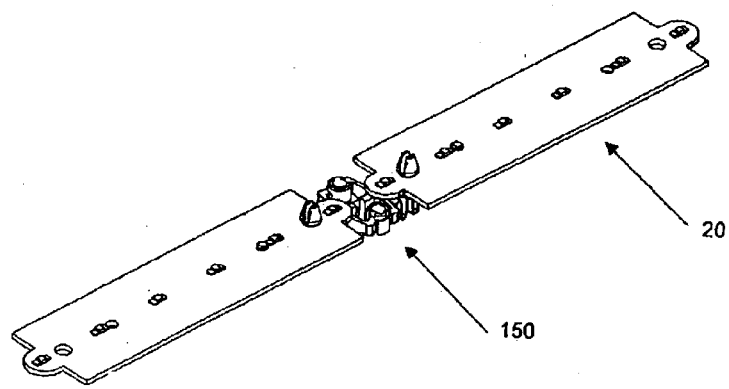
FIG. 9 is a perspective view of a biasing means interconnected with adjacent substrates according to one embodiment of the present invention.
Figure 10:
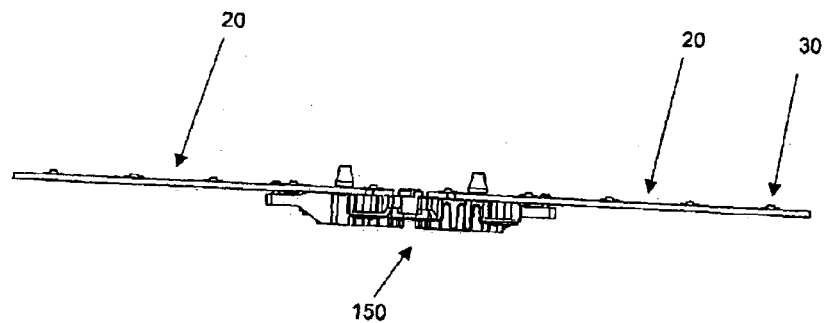
FIG. 10 is a side view of the biasing means and interconnected substrates according to FIG. 9.

One embodiment of the resistive element is illustrated in an exploded view in FIG. 8. In this embodiment, the resistive element is formed by the interconnection of two like elements. Each portion of the resistive element comprises two nodules 200 and 210 which interconnect with mating holes within a substrate as illustrated in FIG. 4. By the interconnection of the resistive element to a single substrate via two points, rotation between the resistive element and the substrate is limited thereby reducing the possibility of the substrates binding within the mounting means associated within the elongated tubular member. FIGS. 9 and 10 illustrate a biasing system interconnected to two substrates according to one embodiment of the invention.

The resistive component can be fabricated from a plurality of materials for example resilient plastic, polycarbonate or other polymer or other material. However the selection of the material must be capable of deformation and provide a restorative force in a wide range temperatures. Material typically becomes more brittle in cold temperatures therefore the selection of the appropriate material can be based on this type of factor for example. A worker skilled in the art would readily understand what other types of materials would be appropriate for the fabrication of the resistive component.

It would be readily understood that the various materials that are selected for the fabrication of all of the components of the elongated lighting apparatus according to the present invention, are capable of maintaining their integrity in a wide range of temperatures, ranging from −60° C. to 60° C., for example.

The embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An elongated lighting apparatus illuminated along its entire length and capable of operation in environments subject to temperature fluctuations, said apparatus comprising:
   a) at least two elongated tubular members each having two ends, each elongated tubular member having a mounting means therein, said elongated tubular members being fabricated from a material that allows the passage of light therethrough and at least one end of each elongated tubular member is an open end, wherein the elongated tubular members are aligned end to end with a region of separation therebetween and at least one open end is adjacent to the region of separation;
   b) at least two substrates, each substrate having a plurality of light emitting devices thereon, at least one substrate being slidably connected to said mounting means within each of the elongated tubular members;
   c) at least two end caps for sealingly engaging with the open ends of the elongated tubular members, at least one end cap having a protrusion projecting towards the region of separation, said protrusion fabricated from a material that allows the passage of light therethrough and having at least one light emitting device proximate thereto;
   d) a flexible interconnector enclosing the region of separation, wherein the flexible interconnector is fabricated from a material that allows the passage of light therethrough, said flexible interconnector being illuminated by the light emitting device proximate to the protrusion; and
   e) means for connecting said plurality of light emitting devices to an electrical power source for energising said light emitting devices.

2. The elongated lighting apparatus according to claim 1, wherein the protrusion has a spherical shape for dispersing illumination from the light emitting devices into the region of separation.

3. The elongated lighting apparatus according to claim 1, wherein the end caps are fabricated from a transparent material.

4. The elongated lighting apparatus according to claim 1, wherein the protrusion has integrated optics for focusing, separating or reflecting illumination generated by the light emitting devices into the region of separation.

5. The elongated lighting apparatus according to claim 1, wherein the end caps comprise an entrance aperture, an exit aperture and a conduit therebetween.

6. The elongated lighting apparatus according to claim 1, wherein the protrusion has a shape of a partial cube or octahedron.

7. The elongated lighting apparatus according to claim 1, wherein the end caps are sealing engaged to the elongated tubular members using a glue or a sealing ring.

8. The elongated lighting apparatus according to claim 1, wherein the elongated tubular members and the substrates have a radius of curvature between 1 meter and 10 meters.

9. The elongated lighting apparatus according to claim 1, wherein the mounting system of at least one elongated tubular member comprises two flanges having a groove therebetween for insertion of at least one substrate therein.

10. The elongated lighting apparatus according to claim 1, wherein the elongated tubular members comprise an external mounting feature for securing the elongated tubular members to a surface.

11. The elongated lighting apparatus according to claim 1, wherein the elongated tubular members have a cross section selected from the group comprising circular, rectangular, trapezoid or octagonal.

12. The elongated lighting apparatus according to claim 1, wherein the elongated tubular members comprise optical characteristics selected from the group comprising diffusion, refraction or reflection thereby spreading or redirecting illumination generated by the light emitting devices.

13. The elongated lighting apparatus according to claim 1, wherein the light emitting devices are arranged in a linear array on the at least two substrates.

14. The elongated lighting apparatus according to claim 1, wherein the light emitting devices are arranged in a planar array on the at least two substrates.

15. The elongated lighting apparatus according to claim 1, wherein the light emitting devices produce illumination having one or more wavelengths.

16. The elongated lighting apparatus according to claim 1, wherein the one or more substrates have a plurality of modification locations for adjustment of the length of the one or more substrates.

17. The elongated lighting apparatus according to claim 1, wherein a controller is electrically connected to the one or more substrates for controlling the illumination of the light emitting devices.

18. The elongated lighting apparatus according to claim 17, wherein the controller provides a means for sequencing illumination of the light emitting diodes.

19. The elongated lighting apparatus according to claim 17, wherein the controller provides a means for regulating illumination level provided by one or more of the light emitting diodes.

20. The elongated lighting apparatus according to claim 1, wherein the flexible interconnector has a bellow shape.

21. The elongated lighting apparatus according to claim 1, wherein the flexible interconnector is interconnected to the end caps.

22. An elongated lighting apparatus illuminated along its entire length and capable of operation in environments subject to temperature fluctuations, said apparatus comprising:
  a) at least two elongated tubular members each having two ends, each elongated tubular member having a mounting means therein, said elongated tubular members being fabricated from a material that allows the passage of light therethrough and at least one end of each elongated tubular member is an open end, wherein the elongated tubular members are aligned end to end with a region of separation therebetween and at least one open end is adjacent to the region of separation;
  b) at least three substrates, each substrate having a plurality of light emitting devices thereon, at least one of the elongated tubular members having at least two substrates slidably connected to said mounting means therein;
  c) at least two end caps for sealingly engaging with the open ends of the elongated tubular members, at least one end cap having a protrusion projecting towards the region of separation, said protrusion fabricated from a material that allows the passage of light therethrough and having at least one light emitting device proximate thereto;
  d) biasing means electrically interconnecting adjacent substrates within a single elongated tubular member, said biasing means providing a resistive force for maintaining a light emitting device proximate to the protrusion upon thermal expansion or contraction of the apparatus;
  e) a flexible interconnector enclosing the region of separation, wherein the flexible interconnector is fabricated from a material that allows the passage of light therethrough, said flexible interconnector being illuminated by the light emitting device proximate to the protrusion; and
  f) means for connecting said plurality of light emitting devices to an electrical power source for energising said light emitting devices.

23. The elongated lighting apparatus according to claim 22, wherein the biasing means comprises two conductive elements and a resistive element, said conductive elements electrically interconnecting the adjacent substrates.

24. The elongated lighting apparatus according to claim 23, wherein the conductive elements each have two ends, wherein a location proximate to each end of the conductive elements is interconnected to the resistive element, thereby forcing deformation of the conductive elements to a middle region.

25. The elongated lighting apparatus according to claim 24, wherein the conductive elements have a spring shape in a middle region.

26. The elongated lighting apparatus according to claim 22, wherein the resistive element has a compressive force therein during operation.

27. The elongated lighting apparatus according to claim 22, wherein deformation of the resistive element is confined to a predetermined region.

* * * * *